(12) United States Patent
Coico et al.

(10) Patent No.: US 9,402,334 B2
(45) Date of Patent: Jul. 26, 2016

(54) METHOD FOR CONTROLLING AIRFLOW OF DIRECTIONAL FLOW PERFORATED TILE

(71) Applicant: International Business Machines Corporation, Armonk, NY (US)

(72) Inventors: Patrick A. Coico, Fishkill, NY (US); David P. Graybill, Staatsburg, NY (US); Allan R. Hoeft, Poughkeepsie, NY (US); Madhusudan K. Iyengar, Woodstock, NY (US); Roger R. Schmidt, Poughkeepsie, NY (US); Gerard V. Weber, Jr., Saugerties, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 0 days.

(21) Appl. No.: 14/100,013

(22) Filed: Dec. 8, 2013

(65) Prior Publication Data

US 2014/0090806 A1    Apr. 3, 2014

Related U.S. Application Data

(62) Division of application No. 13/172,765, filed on Jun. 29, 2011, now abandoned.

(51) Int. Cl.
*H05K 7/20* (2006.01)
*F17D 3/00* (2006.01)

(52) U.S. Cl.
CPC ............. *H05K 7/20836* (2013.01); *F17D 3/00* (2013.01); *H05K 7/20* (2013.01); *Y10T 137/0324* (2015.04); *Y10T 137/6851* (2015.04)

(58) Field of Classification Search
CPC . H05K 7/20736; H05K 7/20745; H05K 7/14; H05K 7/18; H05K 7/20; F17D 1/00; F17D 3/00; B60H 2001/00728
USPC .................................. 454/184, 334, 324, 290
See application file for complete search history.

(56) References Cited

U.S. PATENT DOCUMENTS

| | | | | |
|---|---|---|---|---|
| 3,955,848 | A * | 5/1976 | Lutz et al. ...................... | 296/218 |
| 4,089,557 | A * | 5/1978 | Leiter ............................ | 296/221 |
| 4,534,278 | A * | 8/1985 | Spilde ........................... | 454/322 |
| 4,729,292 | A * | 3/1988 | Marton ................. | F24F 13/075 454/284 |
| 4,945,891 | A * | 8/1990 | Cecil ......................... | 126/299 D |
| 4,964,566 | A * | 10/1990 | Pugh ..................... | E02D 31/008 137/625.33 |
| 5,105,730 | A * | 4/1992 | Smith ................ | B60H 1/00692 251/901 |
| 5,120,273 | A | 6/1992 | Lin ............................... | 454/195 |
| 5,163,871 | A | 11/1992 | Huibregtse et al. ........... | 454/289 |
| 5,218,998 | A * | 6/1993 | Bakken ................... | F24F 13/12 137/625.28 |
| 5,505,379 | A | 4/1996 | Wagner ........................ | 236/49.5 |

(Continued)

FOREIGN PATENT DOCUMENTS

JP    07197631   *  8/1995 ............ E04F 15/024

*Primary Examiner* — Steven B McAllister
*Assistant Examiner* — Frances F Hamilton
(74) *Attorney, Agent, or Firm* — Margaret A. McNamara; Ido Tuchman

(57) ABSTRACT

An air flow control assembly, system, and method for controlling air flow to a server rack. An example air flow control assembly includes a retractable barrier configured to block the air flow, at least partially, from passing through a perforated floor tile to the server rack. The air flow control assembly also includes a barrier mount configured to secure the retractable barrier proximate the perforated floor tile.

8 Claims, 6 Drawing Sheets

(56) References Cited

U.S. PATENT DOCUMENTS

| | | | |
|---|---|---|---|
| 5,782,690 A * | 7/1998 | Gustafson et al. | 454/369 |
| 6,048,263 A * | 4/2000 | Uchida et al. | 454/121 |
| 6,050,893 A * | 4/2000 | Waite | 454/349 |
| 6,074,294 A * | 6/2000 | Stevenson | B60H 1/00692 251/901 |
| 6,089,302 A * | 7/2000 | Britt | 160/98 |
| 6,616,524 B2 | 9/2003 | Storck et al. | 454/184 |
| 6,701,994 B2 * | 3/2004 | Goldenberg et al. | 160/31 |
| 6,981,690 B2 * | 1/2006 | Okumura | B60H 1/00692 251/250 |
| 7,029,055 B2 * | 4/2006 | Bourque et al. | 296/146.16 |
| 7,214,131 B2 | 5/2007 | Malone | 454/184 |
| 7,232,369 B2 | 6/2007 | Karidis et al. | 454/274 |
| 7,447,920 B2 | 11/2008 | Sharma et al. | 713/300 |
| 7,568,360 B1 | 8/2009 | Bash et al. | 62/186 |
| 7,656,660 B2 | 2/2010 | Hoeft et al. | 361/679.51 |
| 7,907,402 B2 | 3/2011 | Caveney | 361/694 |
| 7,992,402 B2 | 8/2011 | VanGilder et al. | 62/259.2 |
| 8,053,926 B2 * | 11/2011 | Lehmann et al. | 307/64 |
| 8,233,274 B2 | 7/2012 | Archibald et al. | 361/679.46 |
| 8,373,988 B2 * | 2/2013 | Chang | H05K 7/1488 361/690 |
| 8,498,114 B2 * | 7/2013 | Martini | 361/695 |
| 8,535,126 B2 * | 9/2013 | Fincher | F24F 11/04 251/329 |
| 9,072,200 B2 * | 6/2015 | Dersch | H05K 7/20745 |
| 2003/0129936 A1 * | 7/2003 | Shaikh | 454/63 |
| 2005/0208888 A1 * | 9/2005 | Moore | F24F 11/053 454/334 |
| 2007/0137635 A1 * | 6/2007 | Feisthammel et al. | 126/299 D |
| 2008/0190467 A1 * | 8/2008 | Maunsell et al. | 134/58 DL |
| 2009/0065595 A1 * | 3/2009 | Kates | F24F 3/0442 236/49.3 |
| 2009/0156114 A1 * | 6/2009 | Ahladas et al. | 454/184 |
| 2010/0130117 A1 * | 5/2010 | Larsen | F24F 11/0001 454/184 |
| 2010/0200578 A1 * | 8/2010 | Song et al. | 219/757 |
| 2010/0201230 A1 * | 8/2010 | Schweitzer, III | H02B 1/50 312/107 |
| 2010/0311317 A1 * | 12/2010 | McReynolds | G05D 23/2716 454/256 |
| 2011/0128697 A1 * | 6/2011 | Schott | G06F 1/20 361/679.46 |
| 2011/0147631 A1 * | 6/2011 | Menassa | F24F 13/12 251/205 |
| 2012/0003912 A1 | 1/2012 | Hoover et al. | 454/184 |
| 2012/0035781 A1 | 2/2012 | Archibald et al. | 700/300 |
| 2012/0164929 A1 | 6/2012 | Meyer | 454/184 |
| 2013/0281003 A1 * | 10/2013 | Newcomer | 454/284 |

\* cited by examiner

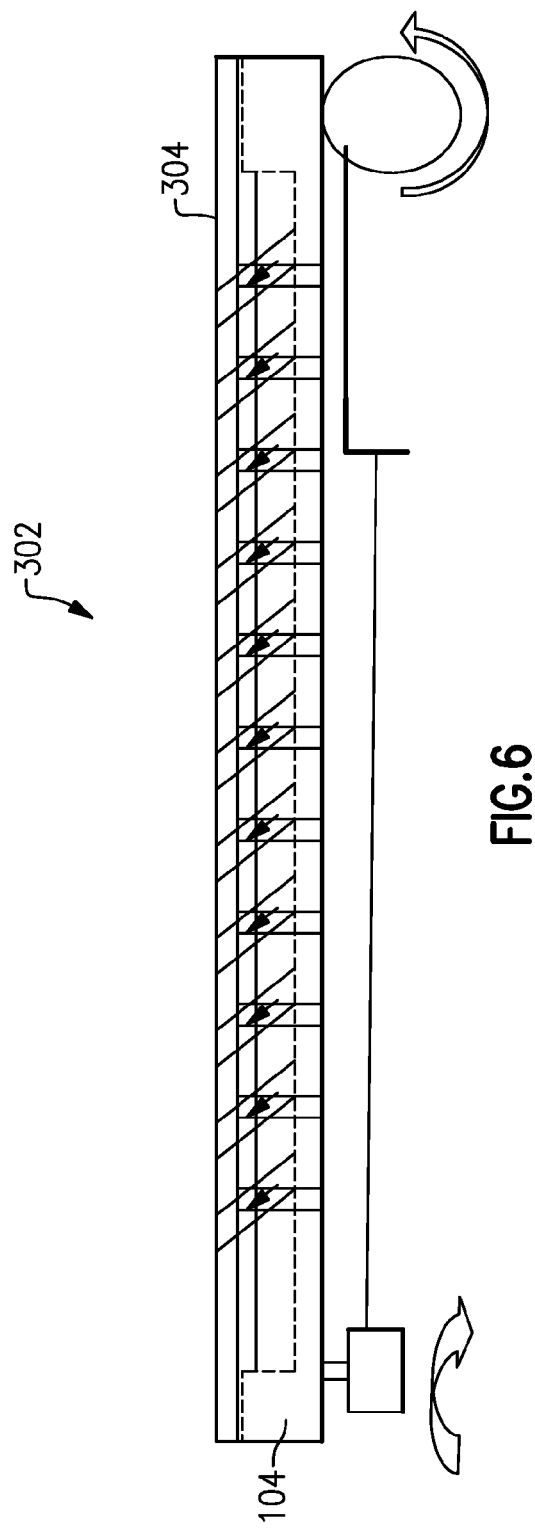

_US 9,402,334 B2_

METHOD FOR CONTROLLING AIRFLOW OF DIRECTIONAL FLOW PERFORATED TILE

CROSS-REFERENCE TO RELATED APPLICATIONS

This application is a divisional application of and claims priority under 35 U.S.C. §121 to U.S. patent application Ser. No. 13/172,765 ("ADJUSTABLE AND DIRECTIONAL FLOW PERFORATED TILES") filed Jun. 29, 2011.

BACKGROUND

The present invention is directed toward server racks with controlled air flow, and more particularly to the use of perforated floor tiles and a retractable barrier to control air flow to server racks.

Modern electronic devices continue to grow smaller and denser to optimize speed and minimize power requirements. Electronic devices may be cooled by various different methods. With the increase of electronic communication and the spread of networks, data centers have been developed to centralize management of network devices. Data centers often include server racks, which contain multiple servers in one storage unit. Servers in the same rack may experience different amounts of activity at different times. Server racks may be placed adjacent to other server racks to form aisles. Some data centers are implemented with raised floors to accommodate cooling systems.

BRIEF SUMMARY

An example embodiment of the present invention is an air flow control assembly for controlling air flow to a server rack. The air flow control assembly may include a retractable barrier configured to block the air flow, at least partially, from passing through a perforated floor tile to the server rack. The air flow control assembly may also include a barrier mount configured to secure the retractable barrier proximate the perforated floor tile.

Another example embodiment of the present invention is a system for controlling air flow to a server rack. The system may include a perforated floor tile and a retractable barrier configured to block the air flow, at least partially, from passing through the perforated floor tile to the server rack. The system may also include a barrier mount configured to secure the retractable barrier proximate the perforated floor tile.

Yet another example embodiment of the invention is a method for controlling air flow to a server rack. The method may include securing an air flow control assembly between a perforated floor tile and a plenum chamber. The air flow control assembly may include a retractable barrier configured to block air flow from the plenum chamber, at least partially, from passing through the perforated floor tile to the server rack. The method may also include controlling the air flow from the plenum chamber to the server rack by retracting and advancing the retractable barrier.

BRIEF DESCRIPTION OF THE DRAWINGS

The subject matter which is regarded as the invention is particularly pointed out and distinctly claimed in the claims at the conclusion of the specification. The foregoing and other objects, features, and advantages of the invention are apparent from the following detailed description taken in conjunction with the accompanying drawings in which:

FIGS. 3 and 6 show an example embodiment of an air flow control assembly and a system including an insert that is coupled to a perforated floor tile.

DETAILED DESCRIPTION

The present invention is described with reference to embodiments of the invention. Throughout the description of the invention reference is made to FIGS. 1-5. As discussed in detail below, embodiments of the present invention include an air flow control assembly, a system, and a method for controlling air flow to a server rack.

Figure 1:
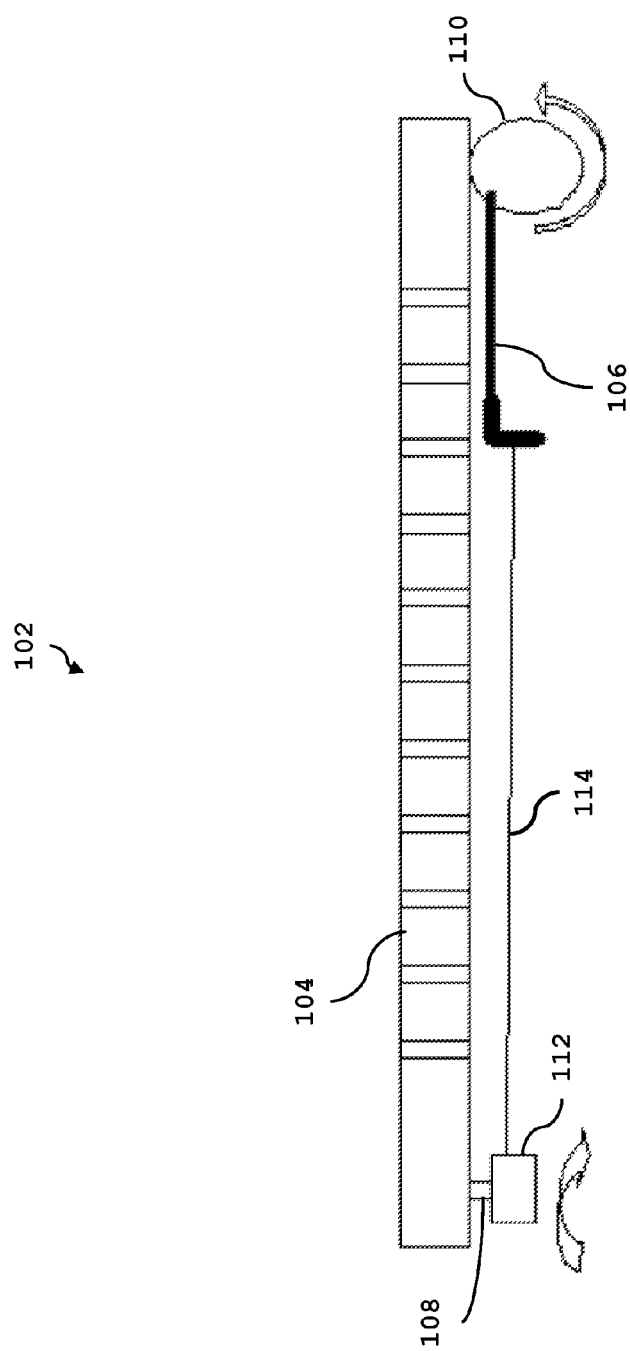
FIG. 1 shows an example embodiment of an air flow control assembly and a system for controlling air flow to a server rack.

FIG. 1 shows an example embodiment of an air flow control assembly and a system 102 for controlling air flow to a server rack. The system may include a perforated floor tile 104 and a retractable barrier 106 configured to block the air flow, at least partially, from passing through the perforated floor tile 104 to the server rack. In one embodiment, the retractable barrier 106 is made from a flexible material. The material may be solid enough to prevent the flow of air yet thin enough so that the material can be rolled up and stored in the spring-loaded roller described below. The retractable barrier may be at least as long as the width of the perforated floor tile 104. The retractable barrier 106 may be configured to retract out of the path of the air flow so that no air flow or no substantial amount of air flow is blocked when the retractable barrier is fully retracted.

In one embodiment, the perforated floor tile 104 is part of a raised floor cooling system. The perforated floor tile 104 may be located in the aisle of a data center. The perforated floor tile 104 may also be located near the front door or inlet side of a server rack, which is one of several server racks that form the aisle. The system may also include a barrier mount 108 configured to secure the retractable barrier 106 proximate the perforated floor tile 104. In one embodiment, the barrier mount 108 is secured to the perforated floor tile 104.

In one embodiment, the barrier mount 108 includes a spring-loaded roller 110 configured to reel in and store the retractable barrier 106. The barrier mount 108 may also include a tension device 112 connected to the retractable barrier 106. The tension device 112 may be configured to unreel the retractable barrier 106 from the spring-loaded roller 110. The tension device 112 may be connected to the spring-loaded roller by a cable 114. In one embodiment, the barrier mount 108 includes guides to control the direction of movement of the retractable barrier 106. The tension device 112 may be adjusted manually. In another embodiment, the tension device 112 is adjusted by an electronic device.

Figure 2:
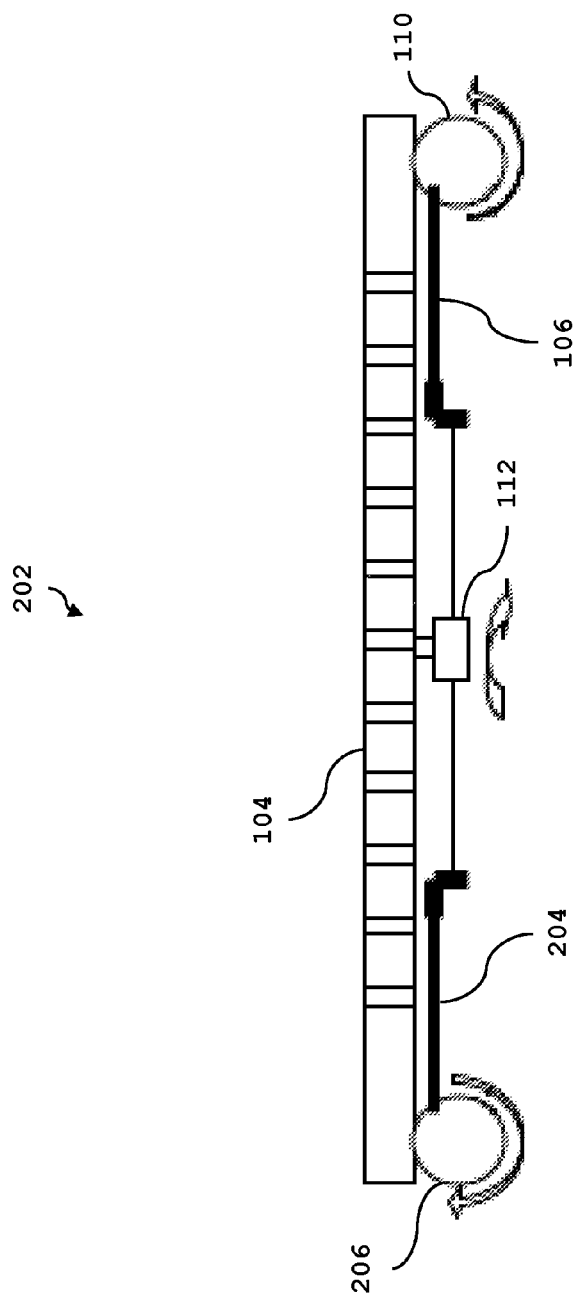
FIG. 2 shows an example embodiment of an air flow control assembly and a system including an additional retractable barrier and spring-loaded roller.

FIG. 2 shows an example embodiment of an air flow control assembly and system 202 for controlling air flow to a server rack. System 202 may contain the elements of system 102 as described above. In one embodiment, system 202 also includes a second retractable barrier 204 connected to the tension device 112. System 202 may include a second spring-loaded roller 206 configured to reel in and store the second retractable barrier 204. Other embodiments contemplated by the present invention may include additional retractable barriers and spring-loaded rollers. In one embodiment, the retractable barrier 106 and second retractable barrier 204 may be simultaneously retracted in different amounts to block different parts of the air flow in different amounts.

Figure 3:
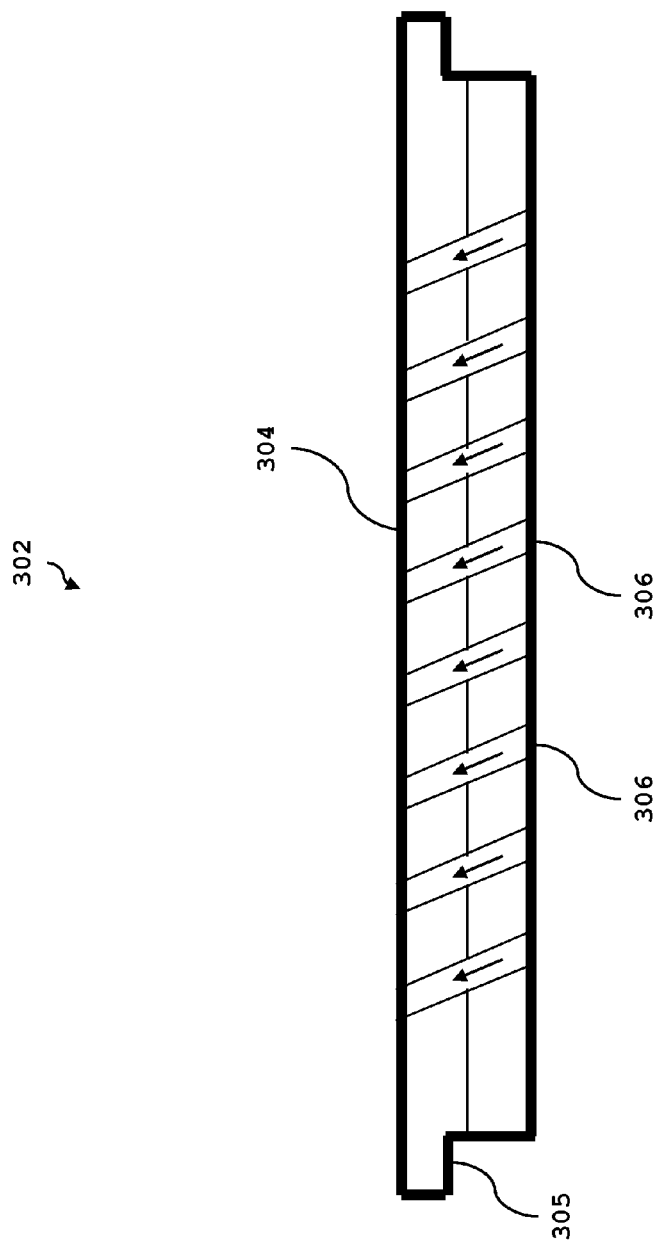

FIGS. 3 and 6 show an example embodiment of an air flow control assembly and system 302 for controlling air flow to a server rack. As shown in FIG. 6, system 302 may contain the elements of system 101 as described above. System 302 may also include an insert 304 that is coupled to a perforated floor tile. The perforated floor tile, though not shown in FIG. 3, may be the perforated floor tile 104 of system 102, and the insert 304 may be included as part of the air flow control assembly and system 102, shown in FIG. 1, as well as other similar embodiments contemplated by the present invention. The insert 304 may be configured to change, at least partially, the speed and/or direction of the air flow. In one embodiment, the insert 304 is made of a plastic material. The insert 304 may be the size of a standard perforation tile of two feet in length by two feet in width. In another embodiment, the insert 304 may have a larger thickness from top to bottom than a standard perforation tile. The insert 304 may include a relief 305 to compensate for the larger thickness.

In one embodiment, the insert 304 includes a plurality of flow control units 306. Each of the flow control units from the plurality of flow control units may be configured to individually control the speed and/or direction of the air flow through the respective flow control unit. In one embodiment, the insert may be altered to cause a change to the speed and/or direction of the air flow. The change may affect the air flow through one or more flow control units from the plurality of flow control units.

In one embodiment, system 302 includes an adjustment unit configured to modify, based on thermal properties of the server rack, one or more flow control unit(s) to cause a change to the speed and/or direction of the air flow through the flow control unit(s).

The flow control units 306 may include individual air flow channels in the insert extending from the top of the insert to the bottom of the insert. The direction of the air flow may be changed by angling the air flow channels. Similarly, the flow control units 306 may be customized individually by the percent of the channel open, flow impedance, and shape of the air flow channel. The flow control units may be customized so that different servers on the same server rack receive different amounts and/or speeds of air flow. The flow control units may be customized individually.

In one embodiment, the angle of a flow control unit may be fixed, but the angle may be customized by manually rotating the insert. In another embodiment, the angle of a flow control unit may be controlled electronically. For example, the adjustment unit may include an electric device to adjust the flow control units 306 based on a temperature reading from a temperature device on a server or server rack. In another embodiment, the electric device is configured to dynamically adjust the flow control units as server loads increase or decrease. For example, the electronic device may adjust the flow control units as server virtualization is utilized to adjust the loads on different servers in the data center.

In one embodiment, the insert and/or retractable barrier is adjusted according to the position of the server rack in the server rack aisle. For example, a different configuration may be used for a server rack at the end of an aisle compared to a server rack in the middle of an aisle. The server rack may be proximate the perforated floor tile 104. In one embodiment, the perforated floor tile 104 is customized in a similar manner as the insert 304. In one embodiment, system 302 includes a plurality of inserts 304 configured to change the air flow at various different angles, speeds, and amounts. The plurality of inserts 304 may be interchangeably used with the same retractable barrier 106. In one embodiment, the plurality of inserts 103 is used together with a plurality of retractable barriers 106.

Figure 4:
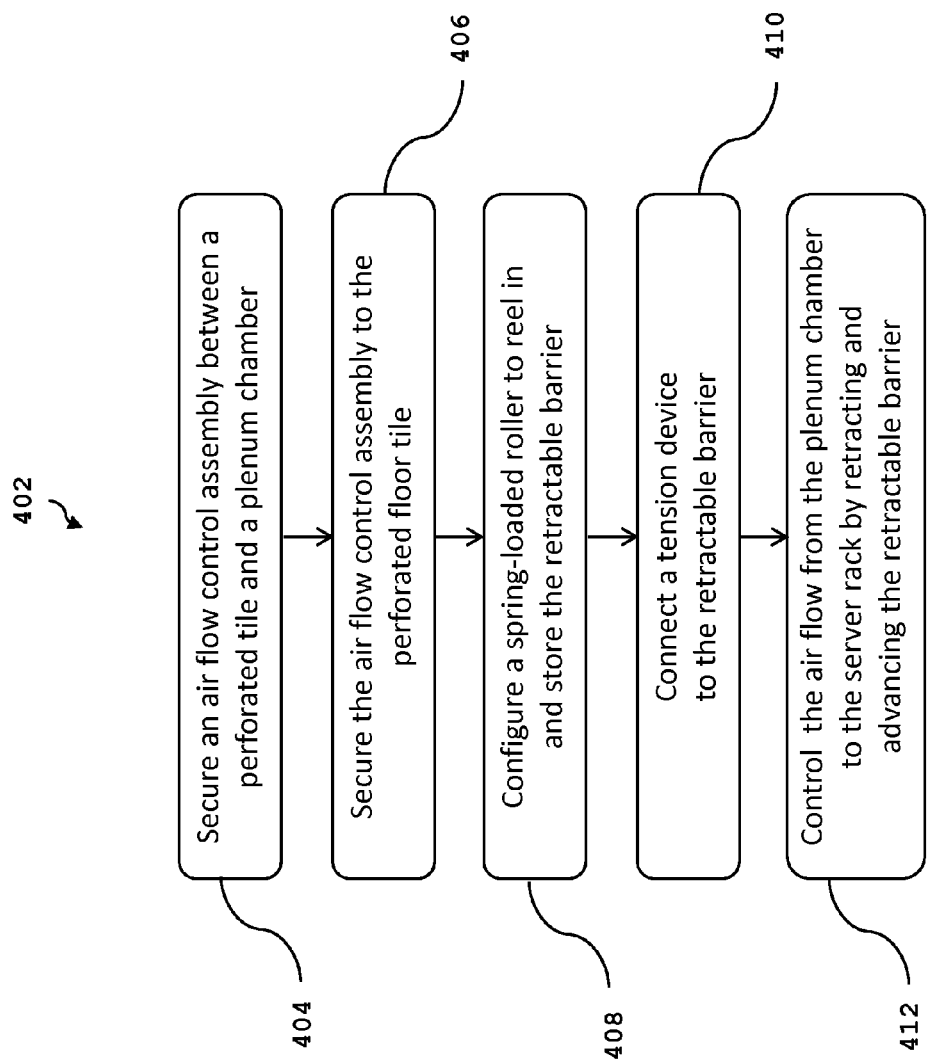
FIG. 4 shows an example embodiment of a method for controlling air flow to a server rack.

FIG. 4 shows an example embodiment of method 402 for controlling air flow to a server rack. The method 402 may include a first securing step 404 of securing an air flow control assembly between a perforated floor tile and a plenum chamber. The air flow control assembly may include a retractable barrier configured to block air flow from the plenum chamber, at least partially, from passing through the perforated floor tile to the server rack. The retractable barrier may be made from a flexible material. In one embodiment, method 402 includes a second securing step 406 of securing the air flow control assembly to the perforated floor tile. The perforated floor tile and air flow control assembly and details for securing such are described in further detail above.

Method 402 may include a roller configuration step 408 of configuring a spring-loaded roller to reel in and store the retractable barrier. In one embodiment, method 402 includes a tension device connecting step 410 of connecting a tension device to the retractable barrier. The tension device may be configured to unreel the retractable barrier from the spring-loaded roller. In one embodiment, the air flow assembly includes the spring-loaded roller and tension device. Method 402 may include a controlling step 412 of controlling the air flow from the plenum chamber to the server rack by retracting and advancing the retractable barrier. The spring loaded roller, tension device, and details for controlling the air flow with the air flow assembly are described above.

Figure 5:
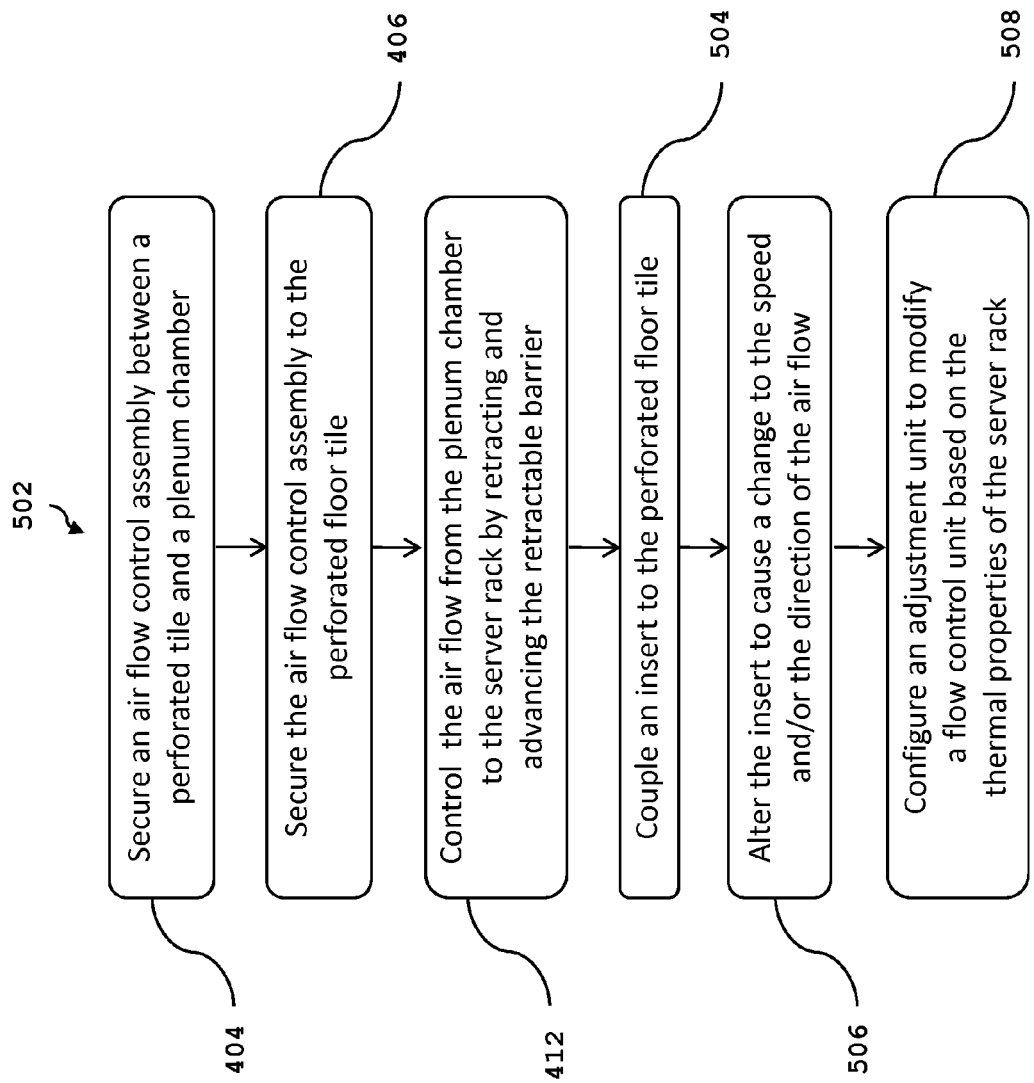
FIG. 5 shows an example embodiment of a method for controlling air flow to a server rack with an additional coupling step.

FIG. 5 shows an example embodiment of method 502 for controlling air flow to a server rack. Method 502 may include the same steps of method 402 described above. Method 502 may also include a coupling step 504 of coupling an insert to the perforated floor tile. The insert may be configured to change, at least partially, the speed and/or direction of the air flow. In one embodiment, the insert includes a plurality of flow control units. Each of the flow control units from the plurality of flow control units may be configured to individually control the speed and/or direction of the air flow through the respective flow control unit. The insert and plurality of flow control units as well as ways for using them to control the air flow are described in greater detail above.

In one embodiment, method 502 includes an altering step 506 of altering the insert to cause a change to the speed and/or direction of the air flow through one or more flow control unit(s) from the plurality of flow control units. Method 502 may also include an adjustment unit configuration step 508 of configuring an adjustment unit to modify, based on thermal properties of the server rack, one or more flow control unit(s) to cause a change to the speed and/or direction of the air flow through the one or more flow control unit(s). Various ways of altering the insert and configuring the adjustment unit are described in greater detail above.

While the preferred embodiments to the invention have been described, it will be understood that those skilled in the art, both now and in the future, may make various improvements and enhancements that fall within the scope of the claims which follow. These claims should be construed to maintain the proper protection for the invention first described.

What is claimed is:

1. A method for controlling air flow to a server rack, comprising:

securing an air flow control assembly between a perforated floor tile and a plenum chamber, the air flow control assembly including a first retractable barrier and a second retractable barrier, the first retractable barrier and a second retractable barrier configured to block air flow from the plenum chamber, at least partially, from passing through the perforated floor tile;

rotating a tension device in a first rotational direction to obstruct air flow from passing though the perforated floor tile from the plenum chamber such that the first retractable barrier unrolls toward the tension device in a first linear direction by a first cable coupled to the tension device and the second retractable barrier unrolls toward the tension device in a second linear direction by a second cable coupled to the tension device, the second linear direction being opposite the first linear direction; and rotating the tension device in a second rotational direction opposite the first rotational direction to permit the air flow from passing though the perforated floor tile from the plenum chamber such that the first retractable barrier rolls away from the tension device in the second linear direction by a first spring-loaded roller and the second retractable barrier unrolls toward the tension device in the first linear direction by a second spring-loaded roller.

2. The method of claim 1, further comprising:

securing the air flow control assembly to the perforated floor tile.

3. The method of claim 1, further comprising:

configuring a spring-loaded roller to reel in and store the retractable barrier; and connecting a tension device to the retractable barrier, the tension device configured to unreel the retractable barrier from the spring-loaded roller.

4. The method of claim 1, wherein the retractable barrier is made from a flexible material.

5. The method of claim 1, wherein the air flow control assembly is entirely between the perforated floor tile and the plenum chamber.

6. The method of claim 1, further comprising coupling an insert to the perforated floor tile, the insert configured to change a direction of the air flow from the perforated floor tile to the server rack.

7. The method of claim 6, wherein the insert includes a plurality of flow control units, each of the flow control units from the plurality of flow control units configured to individually control at least one of the speed and the direction of the air flow through the respective flow control unit.

8. The method of claim 7, further comprising:

altering the insert to cause a change to at least one of the speed and the direction of the air flow through at least one flow control unit from the plurality of flow control units.

* * * * *